(12) United States Patent
Liu

(10) Patent No.: US 7,268,437 B2
(45) Date of Patent: Sep. 11, 2007

(54) SEMICONDUCTOR PACKAGE WITH ENCAPSULATED PASSIVE COMPONENT

(75) Inventor: Sheng-Tsung Liu, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 10/902,002

(22) Filed: Jul. 30, 2004

(65) Prior Publication Data
US 2005/0253231 A1 Nov. 17, 2005

(30) Foreign Application Priority Data
May 14, 2004 (TW) ................................ 93113721 A

(51) Int. Cl.
*H01L 23/52* (2006.01)
*H01L 23/48* (2006.01)
*H01L 29/40* (2006.01)

(52) U.S. Cl. ............................. 257/780; 257/E23.021; 257/737; 257/738; 257/786; 361/760; 361/770; 174/250; 174/52.4; 228/180.22; 228/180.2; 228/248.1

(58) Field of Classification Search ................ 257/678, 257/780, 786, E23.069, E23.021, E21.508, 257/737, 738, 779, 783; 338/309; 228/248.1, 228/180.22, 180.2, 175; 174/250, 52.4, 255, 174/258; 361/760, 770, 767
See application file for complete search history.

(56) References Cited
U.S. PATENT DOCUMENTS

| | | | | |
|---|---|---|---|---|
| 4,510,276 A | * | 4/1985 | Leech et al. | 523/427 |
| 4,774,634 A | * | 9/1988 | Tate et al. | 361/760 |
| 5,315,070 A | * | 5/1994 | Maiwald | 174/250 |
| 5,378,859 A | * | 1/1995 | Shirasaki et al. | 174/261 |
| 5,640,746 A | * | 6/1997 | Knecht et al. | 29/25.35 |
| 5,684,677 A | * | 11/1997 | Uchida et al. | 361/770 |
| 5,738,269 A | * | 4/1998 | Masterton | 228/248.1 |
| 5,931,371 A | * | 8/1999 | Pao et al. | 228/180.22 |
| 5,936,846 A | * | 8/1999 | Jairazbhoy et al. | 361/770 |
| 6,144,558 A | * | 11/2000 | Shiota et al. | 361/760 |
| 6,201,305 B1 | * | 3/2001 | Darveaux et al. | 257/779 |
| 6,445,589 B2 | * | 9/2002 | Chengalva | 361/760 |
| 6,492,737 B1 | * | 12/2002 | Imasu et al. | 257/778 |
| 6,514,792 B2 | * | 2/2003 | Katchmar | 438/107 |
| 6,521,997 B1 | * | 2/2003 | Huang et al. | 257/737 |
| 6,529,115 B2 | * | 3/2003 | Szwarc et al. | 338/309 |

* cited by examiner

*Primary Examiner*—Kenneth Parker
*Assistant Examiner*—Chris C. Chu
(74) *Attorney, Agent, or Firm*—Troxell Law Office, PLLC

(57) ABSTRACT

A semiconductor package with an encapsulated passive component mainly includes at least a substrate having a surface, a passive component and a molding compound. A plurality of SMD pads (Solder Mask Defined pads) and a solder mask are formed on the surface of the substrate. Each SMD pad has an exposed sidewall portion exposed out of the solder mask. A blocking bar is formed between the exposed sidewall portions of the SMD pads. There is at least a flowing channel formed between the blocking bar and the exposed sidewall portions. The passive component is mounted on the surface of the substrate and connected to the SMD pads, the flowing channel is located under the passive component. It is advantageous to fill the molding compound into the flowing channel.

5 Claims, 2 Drawing Sheets

SEMICONDUCTOR PACKAGE WITH ENCAPSULATED PASSIVE COMPONENT

FIELD OF THE INVENTION

The present invention relates to a semiconductor package, more particularly to a package with encapsulated passive component.

BACKGROUND OF THE INVENTION

Generally passive components, such as capacitors, resistors or inductors, are installed in a semiconductor package in order to enhance the electrical performance of a semiconductor package. Passive components are mounted on a substrate and encapsulated inside a molding compound. For example, a conventional semiconductor package with an encapsulated passive component is disclosed in U.S. Pat. No. 6,521,997 entitled "chip carrier for accommodating passive component". Referring to FIG. 1, the semiconductor package comprises a chip carrier 10 (i.e. a substrate), a passive component 20 and a molding compound 30. The chip carrier 10 includes a core layer 11, a solder mask 12 and at least a pair of pads 13. The core layer 11 has a chip-attaching area and a trace-forming area around the chip-attaching area (not showed in the figures). The trace-forming area has a plurality of conductive traces for electrically connecting a chip on the chip-attaching area. The solder mask 12 is coated on the trace forming area. The paired pads 13 are formed on the trace-forming area. The periphery of upper surfaces and sidewalls of the paired pads 13 are covered by the solder mask 12 to be SMD pads (Solder Mask Defined pads), except the central regions of the upper surfaces of the paired pads 13 are exposed out of the openings of the solder mask 12. The solder mask 12 has a recessed portion 14 (i.e. flowing channel) between the paired pads 13. The passive component 20 is mounted on the paired pads 13 by means of the solder paste 40. Then the molding compound 30 is formed on the chip carrier 10 to encapsulate the passive component 20 and to completely fill the recessed portion 14 to prevent voids formed between the passive component 20 and the chip carrier 10. However, the pitch of the paired pads 13 must be reduced to match the size of the passive component 20, especially the passive component 20 gradually becomes smaller and smaller. Because the sidewalls of the paired pads 13 are covered by the solder mask 12 and the recessed portion 14 is formed between the paired pads 13, therefore, the width of the recessed portion 14 formed by the solder mask 12 will become narrower. Moreover, the solder paste 40 may flow into the recessed portion 14 by accident that causes bridging problem.

SUMMARY

The primary objective of the present invention is to provide a semiconductor package with an encapsulated passive component. A substrate has a first pad and a second pad partially exposed out of a solder mask for mounting a passive component. A blocking bar is formed between the first pad and the second pad so that at least a flowing channel is formed between the blocking bar and an exposed sidewall portion of the first pad or the second pad, thereby the flowing channel can be widened for filling a molding compound into the flowing channel without leaving voids between the passive component and the substrate. Moreover, the bridging problem is avoided because the solder pastes among the pads are blocked by the blocking bar.

The secondary objective of the present invention is to provide a substrate for mounting a passive component and a chip. A blocking bar is formed between the first pad and the second pad so that at least a flowing channel is formed between the blocking bar and an exposed sidewall portion of the first pad or the second pad. At least two flowing channels are formed under a small pitch of the paired pads. Moreover, the blocking bar can be used to support the passive component and to separate the solder pastes on the paired pads for preventing the solder pastes from bridging.

The third objective of the present invention is to provide a substrate for mounting a passive component and a chip. The substrate has a solder mask having at least an opening corresponding to each pair of pads. The face-to-face sidewalls of the paired pads are exposed out of the opening so as to form at least a flowing channel for a molding compound to fill in. Accordingly, the flowing channels under a passive component can be widened for filling the molding compound.

A semiconductor package with an encapsulated passive component in accordance with the present invention includes a substrate, a passive component, a plurality of solder pastes, a chip, and a molding compound. The substrate has a first pad, a second pad, a solder mask and a blocking bar. The solder mask has at least an opening. The blocking bar formed between the first pad and the second pad. Preferably, the blocking bar is integrated with the solder mask or is an extra component connecting the solder mask. The upper surface of the first pad is partially exposed out of the opening and the sidewall of the first pad is partially covered by the solder mask, and the upper surface of the second pad is also partially exposed out of the opening and the sidewall of the second pad is partially covered by the solder mask. Moreover, the first pad or/and the second pad has an exposed sidewall portion exposed out of the opening, at least a flowing channel is formed between the blocking bar and the exposed sidewall portion. The passive component is mounted on the surface of the substrate to connect to the first pad and the second pad via the solder pastes, and the flowing channel is located under the passive component. The solder pastes connect the first pad and the second pad with the passive component, moreover, the chip is disposed on the surface of the substrate. The molding compound is formed on the surface of the substrate to seal the chip and the passive component and to easily fill the flowing channel.

DETAILED DESCRIPTION OF THE PRESENT INVENTION

Figure 1:
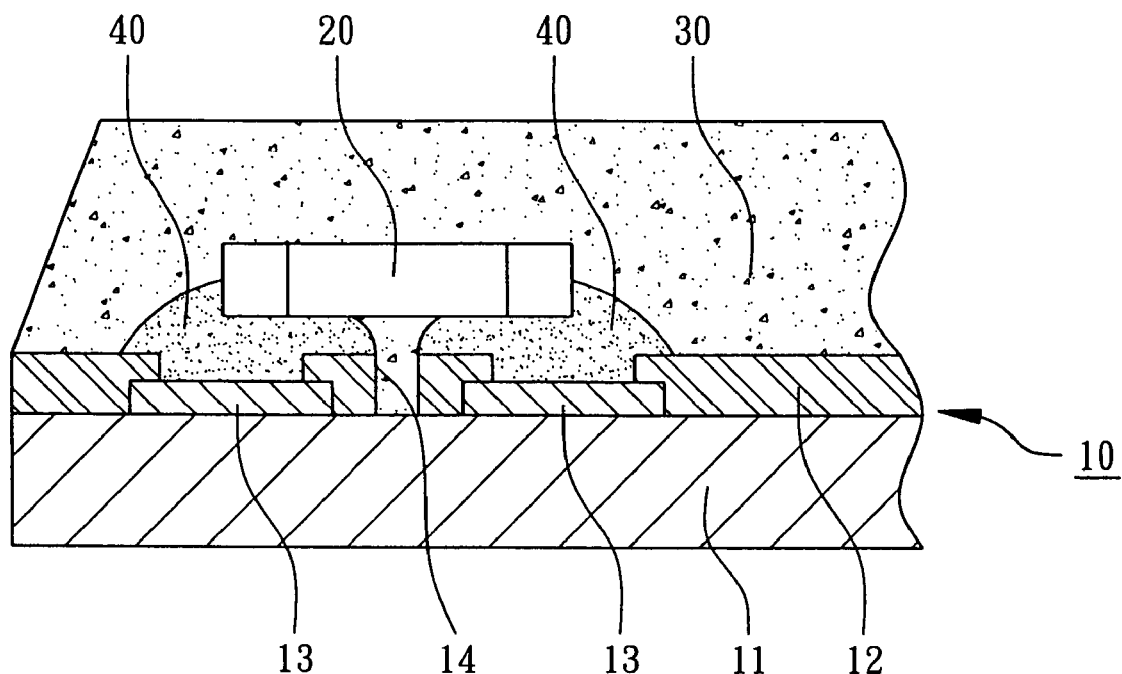
FIG. 1 is a cross-sectional view of a conventional semiconductor package with encapsulated passive component.

Referring to the drawings attached, the present invention will be described by means of the embodiment(s) below.

Figure 2:
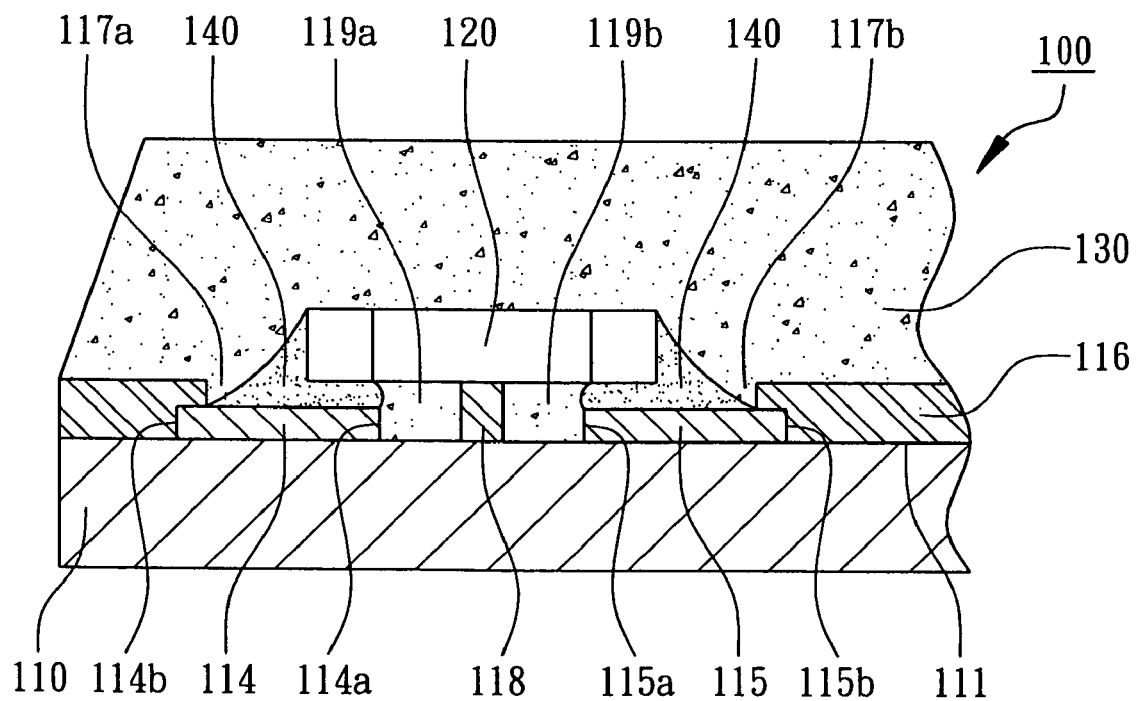
FIG. 2 is a cross-sectional view of a semiconductor package with encapsulated passive component in accordance with the present invention.
Figure 3:
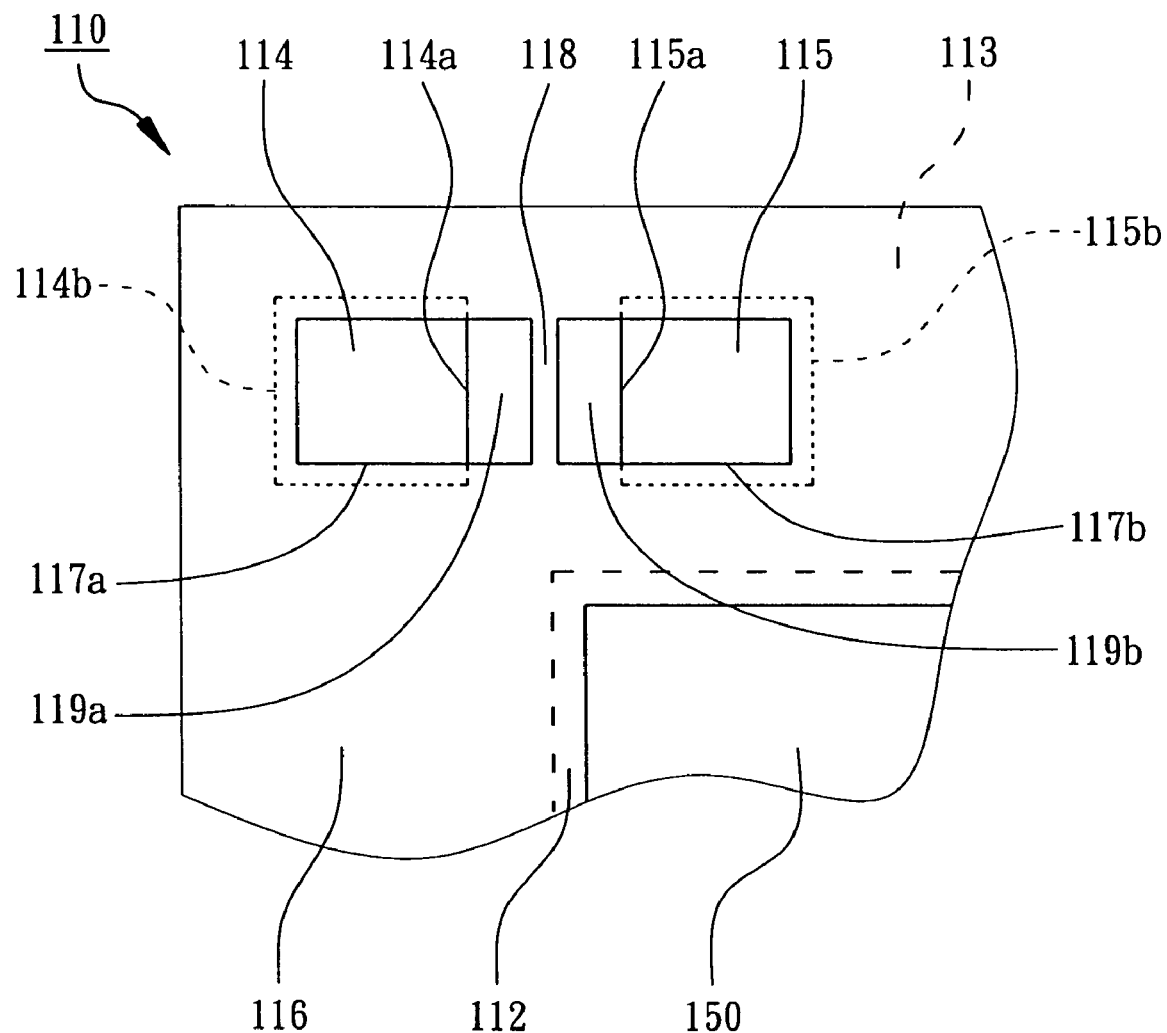
FIG. 3 is a top view of the substrate of the semiconductor package in accordance with the present invention.

Referring to FIG. 2, a semiconductor package 100 with encapsulated passive component in accordance to the embodiment of the present invention, mainly comprises a substrate 110, a passive component 120, a molding compound 130, a plurality of solder pastes 140, and a chip 150. The substrate 110 may be made of epoxy-glass fabric composite resin, such as FR-4, Fr-5, bismaleimide triazine (BT), or a polyimide FPC. Referring to FIG. 3, the substrate 110 has a component-mounting surface 111, which includes a chip-attaching area 112 for mounting a chip 150 and a wiring area 113 surrounding the chip attach area 112 for signal transmission (not showed in the drawings). The substrate 110 includes a first pad 114, a second pad 115 and a solder mask 116, which are formed on the surface 111.

Referring to FIG. 2 and FIG. 3, the first pad 114 and the second pad 115 are formed on the surface 111 of the substrate 110 in pair for connecting the passive component 120 via the solder pastes 140. In this embodiment, the substrate 110 may include a plurality of pairs of the first pads 114 and the second pads 115. One pair of the first pads 114 and the second pads 115 is used to illuminate as shown in FIG. 3. The first pad 114 and the second pad 115 are generally made of a metal like copper and are solder mask defined (SMD) pads.

Referring to FIG. 2 and FIG. 3 again, the solder mask 116 has a first opening 117a, a second opening 117b and a blocking bar 118 formed between the first pad 114 and the second pad 115 (between the first opening 117a and the second opening 117b). In this embodiment, the blocking bar 118 can be integrated with the solder mask 116, i.e., the blocking bar 118 is part of the solder mask 116 and made of the same dielectric material. The blocking bar 118 is defined by the first opening 117a and the second opening 117b. Alternatively, the blocking bar 118 can be an extra component made of insulation material, such as the second solder mask, polyimide tape or thermosetting compound, which can be the same as or different from the material of the solder mask 116. The blocking bar 118 may be connected to the solder mask 116 (not shown in the figures). The first pad 114 has an upper surface and a sidewall. The upper surface of the first pad 114 is partially exposed out of the first opening 117a, and the sidewall of the first pad 114 is partially covered by the solder mask 116. The sidewall of the first pad 114 includes an exposed sidewall portion 114a exposed out of the first opening 117a and a covered sidewall portion 114b covered by the solder mask 116. Moreover, the first opening 117a is intentionally enlarged to make the exposed sidewall portion 114a of the first pad 114 be larger and more obvious in one side. Likewise, the second pad 115 has an upper surface and a sidewall. The upper surface of the second pad 115 is partially exposed out of the second opening 117b, and the sidewall of the second pad 115 is partially covered by the solder mask 116. The sidewall of the second pad 115 has an exposed sidewall portion 115a exposed out of the first opening 117a and a covered sidewall portion 115b covered by the solder mask 116. Moreover the blocking bar 118 has a width smaller than the pitch of the first pad 114 and the second pad 115 so that the blocking bar 118 does not directly contact the exposed sidewall portion 114a of the first pad 114 nor the exposed sidewall portion 115a of the second pad 115. Therefore, a first flowing channel 119a is formed between the blocking bar 118 and the exposed sidewall portion 114a of the first pad 114, and a second flowing channel 119b is formed between the blocking bar 118 and the exposed sidewall portion 115a of the second pad 115. According to the present invention, the first flowing channel 119a and the second flowing channel 119b can be widened to reach over 15 μm in width between fine pitch pads.

The passive component 120 can be a capacitor, a resistor or an inductor with a chip-mounting type for the semiconductor package 100. The passive component 120 is mounted on the surface 111 of the substrate 110. The passive component 120 has the two electrodes thereof that are connected to the first pad 114 and the second pad 115 respectively via the solder pastes 140. The blocking bar 118, the first flowing channel 119a and the second flowing channel 119b are located under the passive component 120 and is not completely covered by the passive component 120 preferably. In this embodiment, the blocking bar will support the passive component 120 to prevent the solder pastes 140 on the corresponding pads 114, 115 from bridging to each other. The exposed sidewall portions 114a and 115a of the first and second pads 114 and 115 are longer than the width of the passive component 120, so that the exposed sidewall portions 114a and 115a can not be completely covered by the passive component 120. After mounting the passive component 120 and the chip 150, the molding compound 130 is formed on the surface 111 of the substrate 110 to seal the chip 150 and the passive component 120. In addition, the molding compound 130 can fill the first flowing channel 119a and the second flowing channel 119b without leaving any voids under the passive component 120. After molding, the solder pastes 140 will not flow under the passive component 120 even the package 10 is processed at high temperature in the subsequent processes. The possibility of bridging and causing short on the passive component 120 is eliminated.

The present invention provides a semiconductor package having a flowing channel which is quite different from the conventional flowing channel simply fabricated through forming a recess on the solder mask 116. According to the present invention, the flowing channels 119a and 119b are formed between the blocking bar 118 and the exposed sidewall portion 114a of the first pad 114 and between the blocking bar 118 and exposed sidewall portion 115a of the second pad 115. The flowing channel 119a and 119b can have a larger width under a limited pitch of the pads 114 and 115. Besides, the more the blocking bars 118 are formed, the more the flowing channels are created. Therefore, the molding compound 130 can smoothly pass through and fill the flowing channel 119a and 119b without leaving any voids between the passive component 120 and the substrate 110. Moreover, the blocking bar 118 can support the passive component 120, therefore, the solder pastes 140 on the first pad 114 and the second pad 115 are completely separated to prevent from bridging to each other.

Furthermore, without departing from the spirit and scope of the present invention, the first pad 114 and the second pad 115 can be circular, rectangular or other shapes, the first opening 117a and the second opening 117b of the solder mask 115 also can be formed as circular, rectangular, or other suitable shape so as to expose the exposed sidewall portion 114a of the first pad 114 and the exposed sidewall portion 115a of the second ball pad 115 respectively. Accordingly, the blocking bar 118, the first flowing channel 119a and the second flowing channel 119b can be formed individually, as the first pad 114, the second pad 115, the first opening 117a, and the second opening 117b are shaped. The first flowing channel 119a and the second flowing channel 119b are located under the passive component 120 to enable the molding compound 130 to fill without leaving any voids between the passive component 120 and the substrate 110.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A semiconductor package with an encapsulated passive component comprising:
   a substrate having a surface, the substrate comprising:
      a solder mask formed on the surface of the substrate and having at least an opening;
      a first pad formed on the surface of the substrate and having an upper surface and a sidewall, wherein the upper surface of the first pad is partially exposed out of the opening, the sidewall of the first pad is partially covered by the solder mask;
      a second pad formed on the surface of the substrate and having an upper surface and a sidewall, wherein the upper surface of the second pad is partially exposed out of the opening, the sidewall of the second pad is partially covered by the solder mask; and
      a blocking bar formed between the first pad and the second pad;
   wherein the first pad has an exposed sidewall portion exposed out of the opening, a first flowing channel is formed between the blocking bar and the exposed sidewall portion of the first pad;
   a passive component mounted on the surface of the substrate, wherein the first flowing channel is located under the passive component;
   a plurality of solder pastes connecting the passive component with the first pad and the second pad;
   a chip disposed on the surface of the substrate; and
   a molding compound formed on the surface of the substrate, the molding compound sealing the chip and the passive component and filling the first flowing channel, wherein the blocking bar and the solder mask are integrally formed, made of a same material and formed at the same time,
   wherein the blocking bar and the exposed sidewall portions of the first pad are longer than the width of the passive component.

2. The package in accordance with claim 1, wherein the blocking bar is located under the passive component.

3. The package in accordance with claim 1, wherein the second pad has an exposed sidewall portion exposed out of the opening, a second flowing channel is formed between the blocking bar and the exposed sidewall portion of the second pad for filling the molding compound.

4. The package in accordance with claim 1, wherein the blocking bar supports the passive component.

5. The package in accordance with claim 1, wherein the width of the first flowing channel is larger than 15 μm.

* * * * *